(12) United States Patent
Yan

(10) Patent No.: US 12,336,163 B2
(45) Date of Patent: Jun. 17, 2025

(54) METHOD OF FORMING BIT LINE CONTACT STRUCTURE USING SERIES OF PICKLING PROCESSES TO REMOVE NATIVE OXIDE ON SURFACE OF THE ACTIVE AREAS

(71) Applicant: CHANGXIN MEMORY TECHNOLOGIES, INC., Hefei (CN)

(72) Inventor: Xun Yan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 302 days.

(21) Appl. No.: 18/149,178

(22) Filed: Jan. 3, 2023

(65) Prior Publication Data

US 2023/0345695 A1 Oct. 26, 2023

(30) Foreign Application Priority Data

Apr. 26, 2022 (CN) .......................... 202210451463.4

(51) Int. Cl.
H10B 12/00 (2023.01)
(52) U.S. Cl.
CPC ........... H10B 12/03 (2023.02); H10B 12/482 (2023.02); H10B 12/485 (2023.02)
(58) Field of Classification Search
CPC ......... H01L 21/76814; H01L 21/76816; H01L 21/76895; H01L 23/481; H10B 12/03; H10B 12/482; H10B 12/485

USPC .......................................................... 438/262
See application file for complete search history.

(56) References Cited

U.S. PATENT DOCUMENTS

2003/0075734 A1* 4/2003 Chun ..................... H10B 12/05
257/E21.654

FOREIGN PATENT DOCUMENTS

CN 113314469 A 8/2021

* cited by examiner

*Primary Examiner* — Hoai V Pham
(74) *Attorney, Agent, or Firm* — Kilpatrick Townsend & Stockton LLP

(57) ABSTRACT

The present disclosure provides a manufacturing method of a semiconductor structure, and a semiconductor structure. The method includes: providing a substrate, where the substrate has active areas, and grooves or holes each for connecting a bit line structure to the active area are formed on a surface of the substrate; forming a protective layer, where the protective layer covers a bottom and a sidewall of each of the grooves or holes; removing the protective layer located at the bottom of each of the grooves or holes; performing pickling to remove a native oxide on a surface of each of the active areas exposed at the bottom of the grooves or holes, where partial protective layer is retained on the sidewall of each of the grooves or holes after pickling; and forming bit line structures.

10 Claims, 7 Drawing Sheets

METHOD OF FORMING BIT LINE CONTACT STRUCTURE USING SERIES OF PICKLING PROCESSES TO REMOVE NATIVE OXIDE ON SURFACE OF THE ACTIVE AREAS

CROSS-REFERENCE TO RELATED APPLICATION

This disclosure claims the priority of Chinese Patent Application No. 202210451463.4, submitted to the Chinese Intellectual Property Office on Apr. 26, 2022, the disclosure of which is incorporated herein in its entirety by reference.

TECHNICAL FIELD

The present disclosure relates to the technical field of semiconductors, and in particular, to a manufacturing method of a semiconductor structure and a semiconductor structure.

BACKGROUND

In the existing memory device process, after the step of etching a bit line contact structure and before the step of depositing polysilicon, a series of pickling processes are required to reduce the contact resistance between the polysilicon and an active area (AA) to remove the native oxide formed on the surface of the exposed active area. Then, the polysilicon is deposited. However, in the existing process, while removing the native oxide, a pickling solution also erodes the oxide on the side of the shallow trench isolation (STI) structure next to the active area; besides, the active area is also eroded while the bit line contact structure is shifted in alignment, resulting in a poor contact effect between the contact structure (NC contact) formed in the subsequent step and the active area.

SUMMARY

According to an aspect of the present disclosure, a manufacturing method of a semiconductor structure is provided, including: providing a substrate, where the substrate has active areas, and grooves or holes each for connecting a bit line structure to the active area are formed on a surface of the substrate; forming a protective layer, where the protective layer covers a bottom and a sidewall of each of the grooves or holes; removing the protective layer located at the bottom of each of the grooves or holes; performing pickling to remove a native oxide on a surface of each of the active areas exposed at the bottom of the grooves or holes, where partial protective layer is retained on the sidewall of each of the grooves or holes after pickling; and forming bit line structures.

According to another aspect of the present disclosure, a semiconductor structure is provided, which is manufactured by a manufacturing method of a semiconductor structure comprising:
providing a substrate, wherein the substrate has active areas, and grooves or holes each for connecting a bit line structure to the active area are formed on a surface of the substrate;
forming a protective layer, wherein the protective layer covers a bottom and a sidewall of each of the grooves or holes;
removing the protective layer located at the bottom of each of the grooves or holes;
performing pickling to remove a native oxide on a surface of each of the active areas exposed at the bottom of the grooves or holes, wherein partial protective layer is retained on the sidewall of each of the grooves or holes after pickling; and
forming bit line structures.

According to further another aspect of the present disclosure, a semiconductor structure is provided, including a substrate, bit line structures, and a protective layer, where the bit line structures are arranged on the substrate, and the protective layer is located on sidewalls of the bit line structures in an extension direction.

BRIEF DESCRIPTION OF THE DRAWINGS

The preferred implementations of the present disclosure will be described below in detail with reference to the accompanying drawings to make the objectives, features and advantages of the present disclosure more obvious. The accompanying drawings are merely exemplary illustrations of the present disclosure, and are not necessarily drawn to scale. The same reference numerals in the accompanying drawings always represent the same parts. In the drawings.

DETAILED DESCRIPTION

The typical embodiments embodying the features and advantages of the present disclosure are described in detail below. It should be understood that the present disclosure may have various changes in different embodiments, which do not depart from the scope of the present disclosure. The description and accompanying drawings herein are essentially used for the purpose of explanation, rather than limiting the present disclosure.

Different exemplary implementations of the present disclosure are described below with reference to the accompanying drawings. The accompanying drawings form a part of the present disclosure, which show by way of example different exemplary structures, systems, and steps that can implement various aspects of the present disclosure. It should be understood that other specific solutions of components, structures, exemplary apparatuses, systems, and steps may be used, and structural and functional modifications may be made without departing from the scope of the present disclosure. Moreover, although the terms such as "above", "between", and "within" may be used in this specification to describe different exemplary features and elements of the present disclosure, these terms are used herein only for convenience of description, for example, according to the directions of the examples in the accompanying drawings. Nothing in this specification should be understood as requiring a specific three-dimensional direction of the structure to fall within the scope of the present disclosure.

Figure 1:
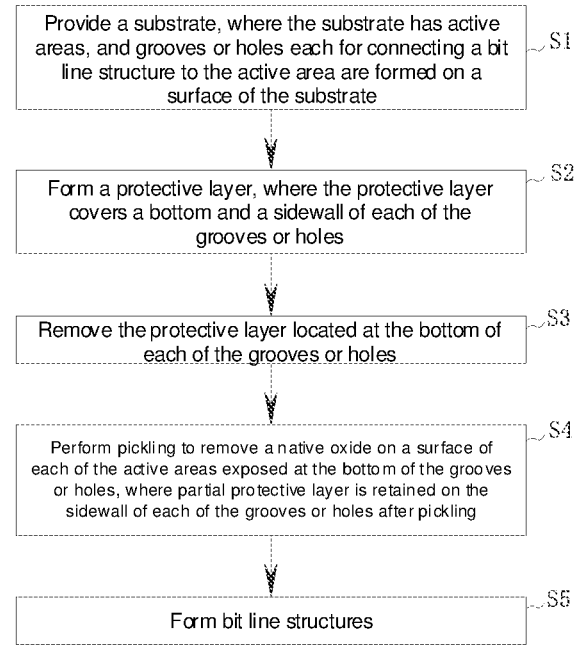
FIG. 1 is a flowchart of a manufacturing method of a semiconductor structure according to an exemplary implementation.

FIG. 1 representatively illustrates a flowchart of a manufacturing method of a semiconductor structure according to the present disclosure. In the exemplary implementation, the manufacturing method of a semiconductor structure proposed by the present disclosure is described by taking its application to a semiconductor memory device as an example. It is understandable for those skilled in the art that, in order to apply the relevant design of the present disclosure to other types of semiconductor structures, various modifications, additions, substitutions, deletions or other changes may be made to the following specific implementations, but such changes are still within the scope of the principle of the manufacturing method of a semiconductor structure proposed by the present disclosure.

Figure 2:
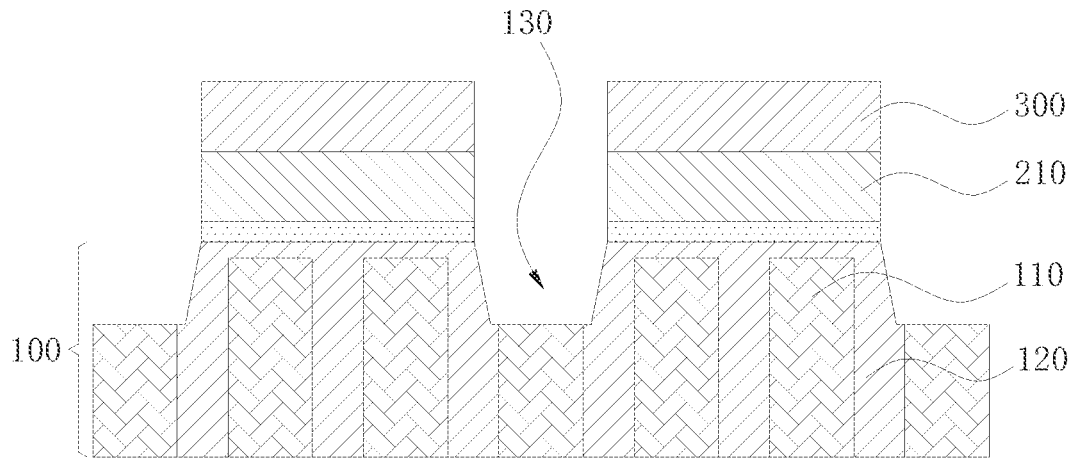
FIG. 2 to FIG. 13 are schematic structural diagrams of a semiconductor structure in several steps in the manufacturing method of a semiconductor structure in FIG. 1.

As shown in FIG. 1, FIG. 2, FIG. 3 and FIG. 4, in this implementation, the manufacturing method of a semiconductor structure proposed by the present disclosure includes the following steps:

Step S1 (as shown in FIG. 2): Provide a substrate 100, where the substrate 100 has active areas 110, and grooves or holes 130 each for connecting a bit line structure 500 to the active area 110 are formed on a surface of the substrate 100.

Figure 3:
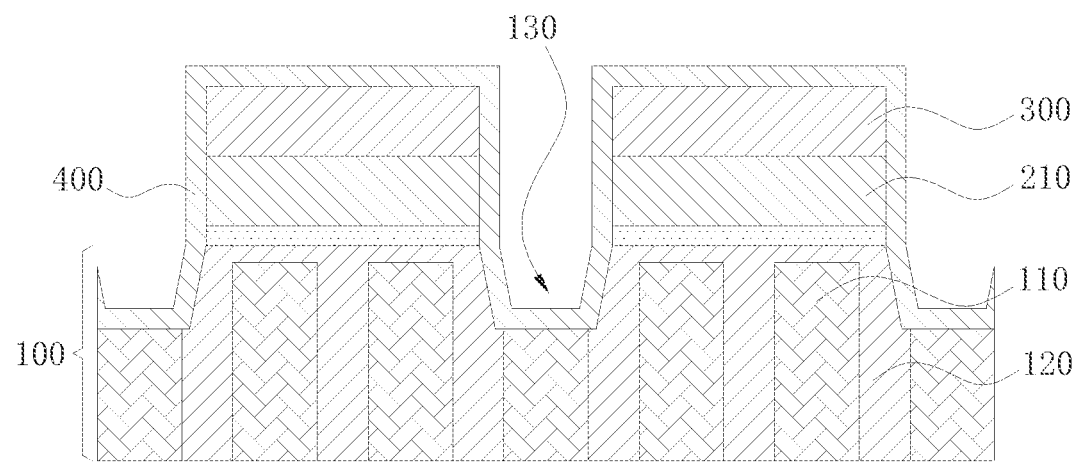

Step S2 (as shown in FIG. 3): Form a protective layer 400, where the protective layer 400 covers a bottom and a sidewall of each of the grooves or holes 130.

Figure 4:
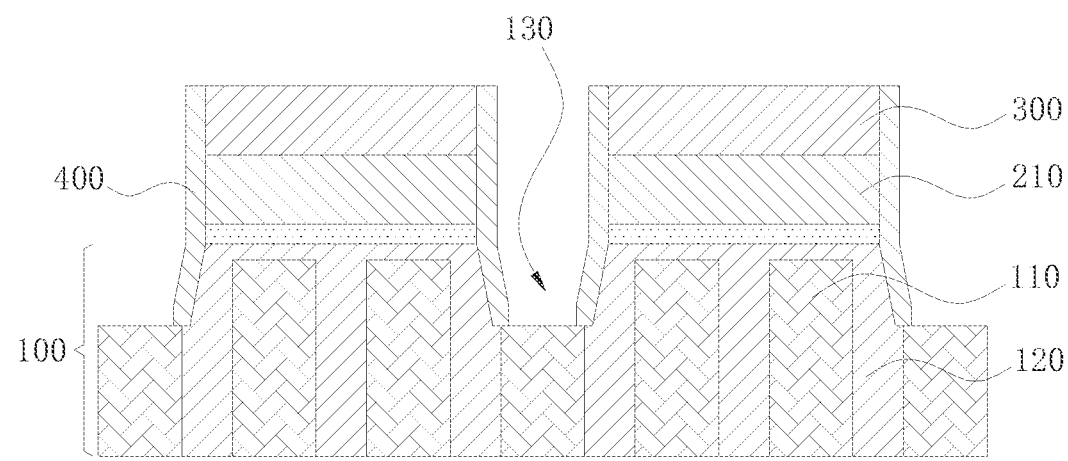

Step S3 (as shown in FIG. 4): Remove the protective layer 400 located at the bottom of each of the grooves or holes 130.

Figure 5:
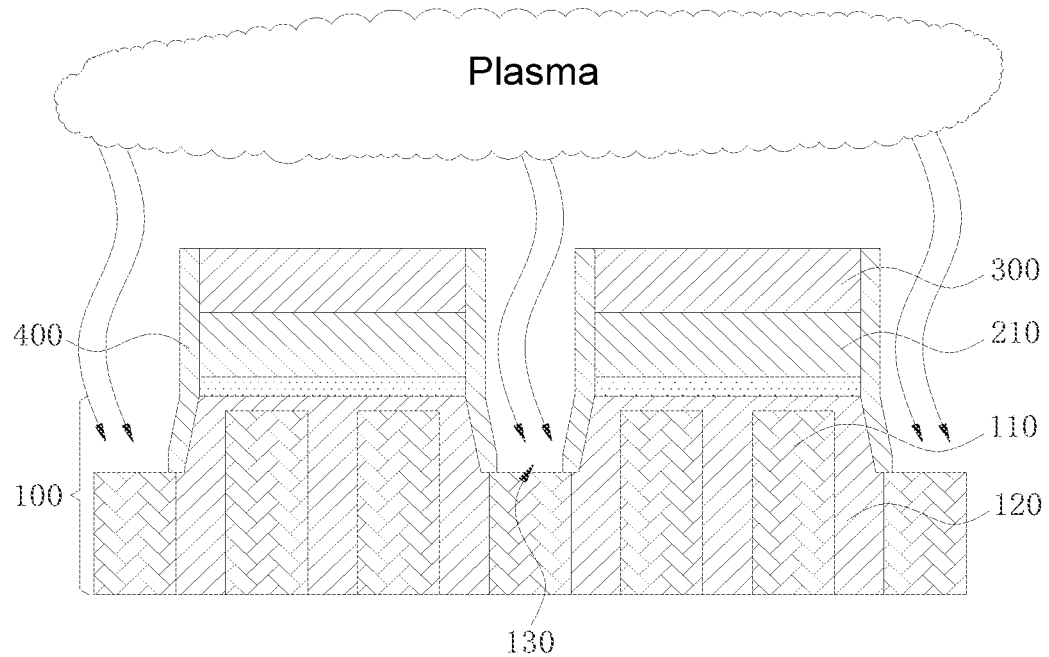

Step S4 (as shown in FIG. 5): Perform pickling to remove a native oxide on a surface of each of the active areas 110 exposed at the bottom of the grooves or holes 130, where partial protective layer 400 is retained on the sidewall of each of the grooves or holes 130 after pickling.

Step S5: Form bit line structures 500.

Through the foregoing design, in the present disclosure, partial protective layer 400 retained on the sidewall of each of the grooves or holes 130 is used to protect the sidewall of each of the grooves or holes 130 or the shallow trench isolation structure 120 next to each of the active areas 110 from being eroded in the pickling step, to ensure effective contact between a contact structure (such as the capacitive contact layer 600) formed in a subsequent process and the active area 110, thereby improving the device performance of the semiconductor structure and alleviating or avoiding voids and leakage current. In contrast, etching of the bit line contact structure in the existing process causes damage to each of the grooves or holes nearby or to the shallow trench isolation structure next to the active area and the active area. In the case of alignment shift, more damage is caused to the active area nearby, and a groove is formed by etching the active area. When the bit line isolation material is deposited subsequently, more isolation material will be deposited in the grooves formed in the active area through etching. When the capacitor contact structure is formed subsequently, the isolation material (e.g. nitride) and oxide in the contact hole need to be removed through etching. Because different materials have different etch selectivities, nitride is more difficult to etch than oxide. Therefore, it is difficult to remove the deposited nitride in the damaged active area completely, and the contact hole cannot be effectively connected to the active area.

Specifically, in an implementation of the present disclosure, step S4 of performing pickling to remove a native oxide on a surface of each of the active areas 110 exposed at the bottom of the grooves or holes 130 may specifically include: washing the surface of each of the active areas 110 exposed at the bottom of the grooves or holes 130 by a pickling solution, and performing plasma surface treatment on the surface of each of the active areas 110 exposed at the bottom of the grooves or holes 130.

Figure 6:
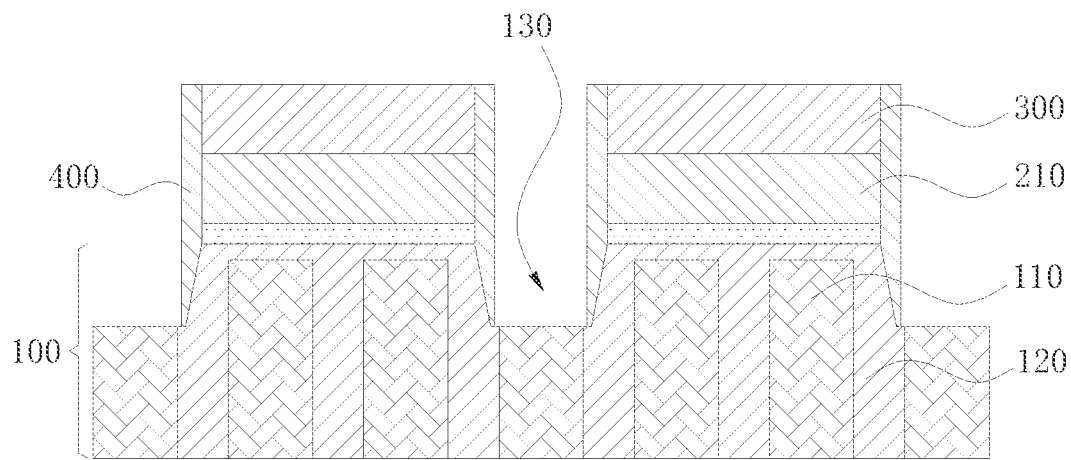

Further, in an implementation of the present disclosure, the step of washing the surface of each of the active areas 110 exposed at the bottom of the grooves or holes 130 by a pickling solution may specifically include: washing the surface of each of the active areas 110 exposed at the bottom of the grooves or holes 130 by a first pickling solution (as shown in FIG. 4), and then the surface of each of the active areas 110 exposed at the bottom of the grooves or holes 130 by a second pickling solution (as shown in FIG. 6).

In an implementation of the present disclosure, the first pickling solution may be DSP, that is, a mixed solution of dilute sulfuric acid and hydrogen peroxide, which is a common pickling solution in this field and can be purchased or prepared. In some implementations, the first pickling solution may alternatively be a mixture of other acid solutions or acid-containing solutions, which is not limited to this implementation.

In an implementation of the present disclosure, the second pickling solution may be a mixture of ozone, water, and hydrofluoric acid (for example, the content of O3 is 800-2000 mL/min/L, and the content of HF 400-1200 ppm), which is a common pickling solution in this field. In some implementations, the second pickling solution may alternatively be a mixture of other acid solutions or acid-containing solutions, which is not limited to this implementation.

As shown in FIG. 5, in an implementation of the present disclosure, the step of washing the surface of each of the active areas 110 exposed at the bottom of the grooves or holes 130 by a second pickling solution may further include: during washing with the second pickling solution, performing plasma surface treatment on the surface of each of the active areas 110 exposed at the bottom of the grooves or holes 130.

In an implementation of the present disclosure, the material of the plasma in the plasma surface treatment may be a mixture of $NF_3$, $H_2$ and nitrogen (protection gas), where a volume ratio of $NF_3$ to $H_2$ may be 8:(250-350), and a flow rate of nitrogen is 2000-4000 mL/min, and the treatment time is 33-99 s. In some implementations, the material of plasma may be another gas, which is not limited to this implementation.

The conditions of the pickling and the plasma surface treatment are not particularly limited, provided that partial protective layer is still retained after the treatment.

In an implementation of the present disclosure, in step S2 of forming a protective layer 400, a thickness of the protective layer 400 may be 5 nm to 15 nm, for example, 5 nm, 10 nm, 12 nm, 15 nm or the like. With such a thickness, partial protective layer can still be retained after pickling. In some implementations, the thickness of the protective layer 400 may also be less than 5 nm, or greater than 15 nm, for example, 4 nm or 16 nm, provided that partial protective layer (for example, 3 nm to 9 nm) can still be retained after the pickling step, which is not limited to this implementation.

In an implementation of the present disclosure, in step S4 of performing pickling to remove a native oxide on a surface of each of the active areas 110 exposed at the bottom of the grooves or holes 130, the thickness of the pickling protective layer 400 retained on the sidewall of each of the grooves or holes 130 may be 3 nm to 9 nm, for example, 3 nm, 5 nm, 7 nm, or 9 nm.

In an implementation of the present disclosure, a material of the protective layer 400 may be undoped polysilicon. In some implementations, the protective layer 400 may also be made of other materials, such as silicon nitride, which is not limited to this implementation.

As shown in FIG. 4, in an implementation of the present disclosure, a first contact material layer 210 and a sacrificial layer 300 sequentially laminated are formed on the surface of the substrate 100, the formed protective layer 400 covers the sacrificial layer 300, the bottom and sidewall of each of the grooves or holes 130, and the sacrificial layer 300. Step S3 of removing the protective layer 400 located at the bottom of each of the grooves or holes 130 further includes removing the protective layer 400 at a top of the sacrificial layer 300.

In an implementation of the present disclosure, a material of the first contact material layer 210 may be doped polysilicon.

In an implementation of the present disclosure, a material of the sacrificial layer 300 may be silicon oxide ($SiO_2$).

As shown in FIG. 7, FIG. 8, FIG. 9, and FIG. 10, in an implementation of the present disclosure, step S5 of forming bit line structures 500 may specifically include:

forming a second contact material layer 220, where the second contact material layer 220 covers the protective layer 400 and the sacrificial layer 300, and the grooves or holes 130 are filled with the second contact material layer 220;

removing the sacrificial layer 300, the protective layer 400 formed on the sidewall of the sacrificial layer 300, and partial second contact material layer 220, where the remaining second contact material layer 220, the remaining protective layer 400, and the first contact material layer 210 form a bit line contact layer 510;

sequentially forming a bit line barrier layer 520, a bit line conductive layer 530 and a first isolation layer 541 on a surface of the bit line contact layer 510;

etching to partially remove the bit line contact layer 510, the bit line barrier layer 520, the bit line conductive layer 530, and the first isolation layer 541, to form a plurality of wall structures P on the surface of the substrate 100; and forming a second isolation layer 542, where the second isolation layer 542 covers the wall structures P and the substrate 100; the second isolation layer 542 and the first isolation layer 541 form a bit line isolation layer 540; and the bit line isolation layer 540, the bit line conductive layer 530, the bit line barrier layer 520 and the bit line contact layer 510 form a bit line structure 500.

It should be noted that, in the present disclosure, the protective layer 400 can provide a shielding effect. Specifically, during forming of the second contact material layer 220, the protective layer 400 retained on the sidewall of each of the grooves or holes 130 can prevent the material for forming the second contact material layer 220 (such as phosphorus, P) from diffusing to the peripheral active area 110 and the word line under the surface of wafer (that is, the buried word line, such as nitride and tungsten) or other areas through each of the grooves or holes 130, avoiding serious leakage current.

In an implementation of the present disclosure, a method for forming the second isolation layer 542 may specifically include: sequentially forming a silicon nitride layer, a silicon oxide layer, and a silicon nitride layer on the wall structure P and the surface of the substrate 100, that is, a "nitride-oxide-nitride" three-layer deposited structure, to form the second isolation layer 542. In some implementations, the method for forming the second isolation layer 542 may only include forming a silicon nitride layer on the wall structure P and the surface of the substrate 100, or only include the silicon oxide layer on the wall structure P and the surface of the substrate 100, which is not limited to this implementation.

In an implementation of the present disclosure, a material of the second contact material layer 220 may be doped polysilicon.

In an implementation of the present disclosure, a material of the bit line barrier layer 520 may be titanium nitride (TiN). In some implementations, the material of the bit line barrier layer 520 may also be tantalum nitride (TaN) or the like, which is not limited to this implementation.

In an implementation of the present disclosure, a material of the bit line conductive layer 530 may be tungsten (W). In some implementations, the material of the bit line conductive layer 530 may alternatively be molybdenum (Mo), which is not limited to this implementation.

In an implementation of the present disclosure, a material of the first isolation layer 541 may be silicon nitride (such as $Si_3N_4$).

Figure 13:
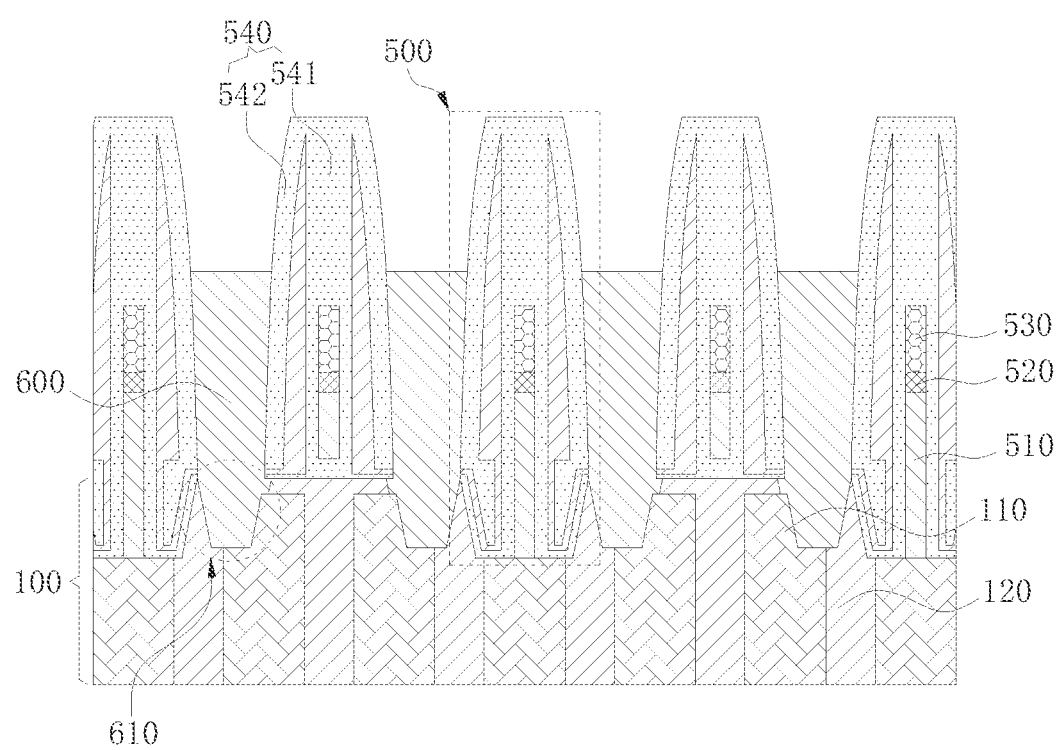

As shown in FIG. 13, in an implementation of the present disclosure, the manufacturing method of a semiconductor structure according to the present disclosure may further include:

forming a capacitive contact layer 600, where the capacitive contact layer 600 is located between adjacent ones of the bit line structures 500.

Figure 11:
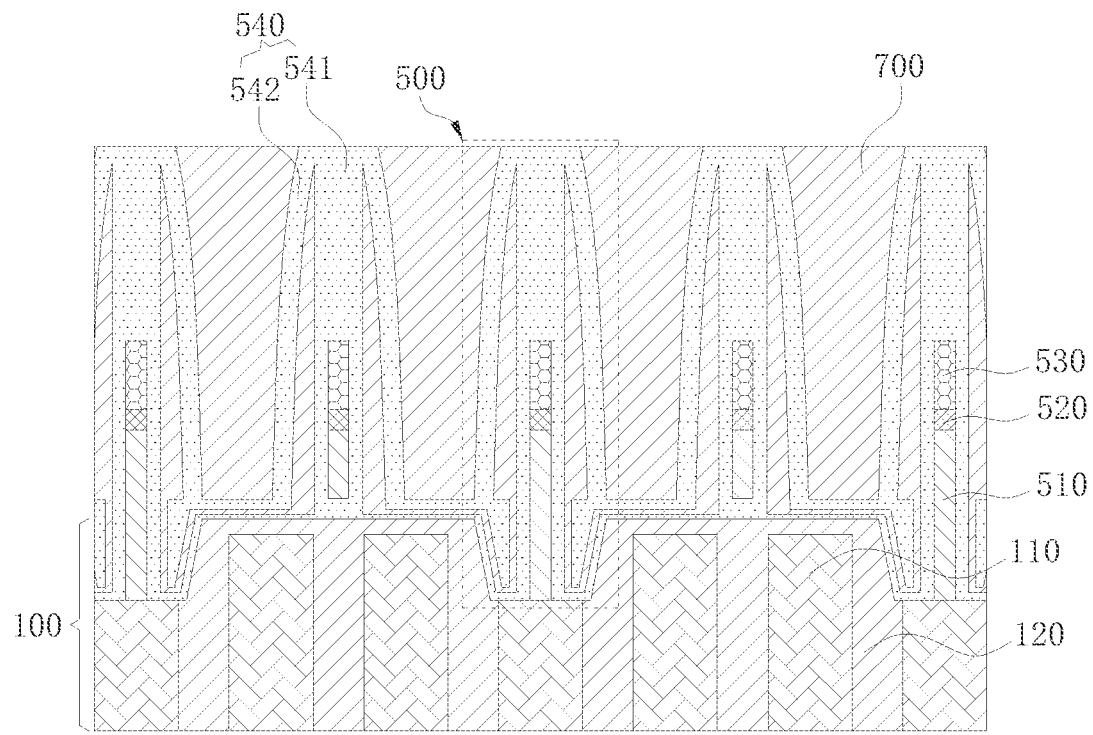
Figure 12:
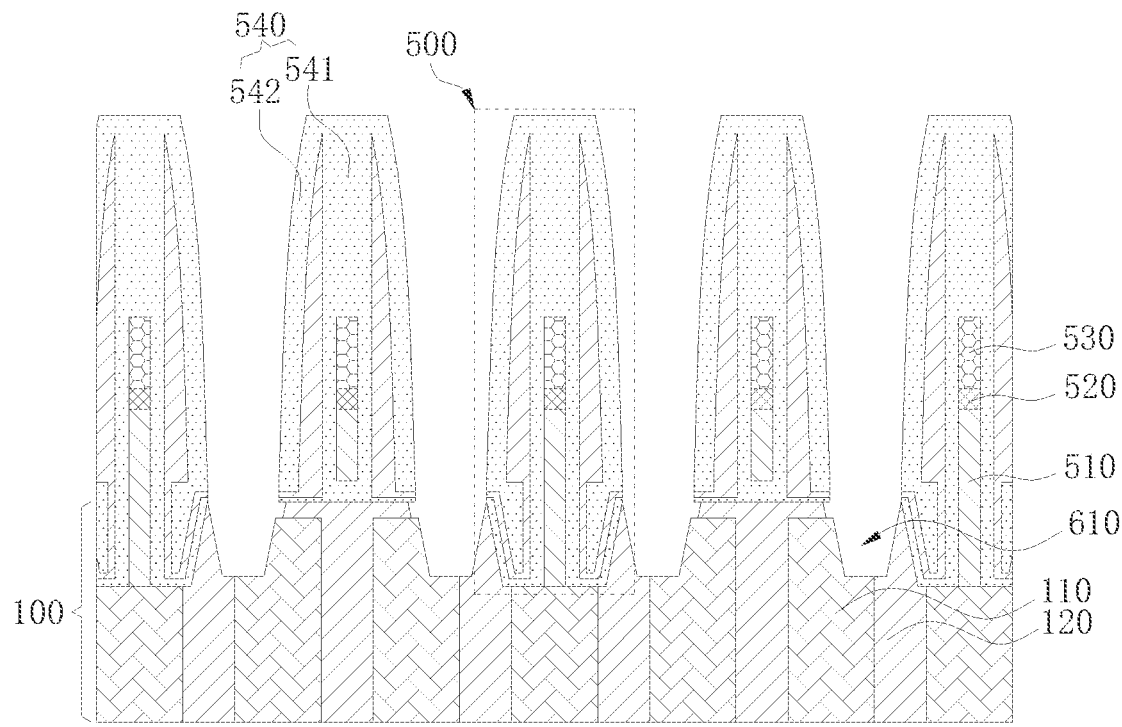

As shown in FIG. 11, FIG. 12, and FIG. 13, in an implementation of the present disclosure, the step of a capacitive contact layer 600 may specifically include:

filling a space between adjacent ones of the bit line structures 500 with an oxide material layer 700, and etching the substrate 100 located between adjacent ones of the bit line structures 500 by the oxide material layer 700, to expose expected active area 110;

forming a third contact material layer, where the third contact material layer is located between adjacent ones of bit line structures 500 and is in contact with the expected active area 110; and partially removing the third contact material layer, where the remaining third contact material layer forms the capacitive contact layer 600.

In an implementation of the present disclosure, a material of the third contact material layer may be polysilicon, for example, doped polysilicon.

Referring to FIG. 2 to FIG. 13, FIG. 2 to FIG. 13 representatively show a laminated structure of the semiconductor structure in several steps of the manufacturing method of a semiconductor structure proposed by the present disclosure. The steps of the manufacturing method of a semiconductor structure are described in detail below with reference to the accompanying drawings.

As shown in FIG. 2, in an implementation of the present disclosure, in step S1 of "providing a substrate 100", the semiconductor structure includes a substrate 100, a first contact material layer 210, and a sacrificial layer 300. Specifically, the substrate 100 includes active areas 110 and shallow trench isolation structures 120, where the shallow trench isolation structure 120 is located between adjacent active areas 110 to isolate adjacent active areas 110. Grooves or holes 130 each for connecting a bit line structure to one of the active areas are formed on the surface of the substrate 100, and top surfaces of some of the active areas 110 are exposed at the bottom of the grooves or holes 130. In an implementation, the first contact material layer 210 covers partial surface of the substrate 100 on which each of the grooves or holes 130 is not formed. The sacrificial layer 300 covers the first contact material layer 210.

As shown in FIG. 3, in an implementation of the present disclosure, in step S2 of "forming a protective layer 400", the semiconductor structure includes a substrate 100, a first contact material layer 210, a sacrificial layer 300, and a protective layer 400. Specifically, the protective layer 400 covers partial first contact material layer 210, partial sacrificial layer 300, and partial substrate 100 not covered by the first contact material layer 210, that is, the protective layer 400 covers the sidewall and bottom of each of the grooves or holes 130.

As shown in FIG. 4, in an implementation of the present disclosure, in step S3 of "removing the protective layer 400 located at the bottom of each of the grooves or holes 130", the semiconductor structure includes the substrate 100, the first contact material layer 210, the sacrificial layer 300, and the remaining protective layer 400 after etching. Specifically, partial protective layer 400 located at the bottom of each of the grooves or holes 130 is removed through etching, and partial protective layer 400 located at the top of the sacrificial layer 300 may not be removed through etching, or may be removed through etching. Therefore, after step S3, the remaining protective layer 400 is located on the sidewall of each of the grooves or holes 130.

As shown in FIG. 5, in an implementation of the present disclosure, in step S4 of "performing pickling to remove a native oxide on a surface of each of the active areas 110 exposed at the bottom of the grooves or holes 130", the surface of each of the active areas 110 exposed at the bottom of the grooves or holes 130 is washed by a pickling solution, and plasma surface treatment is performed on the surface of each of the active areas 110 exposed at the bottom of the grooves or holes 130. Specifically, a mixed solution of the dilute sulfuric acid and the hydrogen peroxide can be used as a first pickling solution for washing, and then a mixture of ozone, water, and hydrofluoric acid is used as a second pickling solution for washing. In addition, during washing with the second pickling solution, plasma surface treatment can be performed on the surface of each of the active areas 110 exposed at the bottom of the grooves or holes 130, that is, the surface of each of the active areas 110 exposed at the bottom of the grooves or holes 130 is processed by plasma.

As shown in FIG. 6, in an implementation of the present disclosure, in step S4 of "performing pickling to remove a native oxide on a surface of each of the active areas 110 exposed at the bottom of the grooves or holes 130", the semiconductor structure includes the substrate 100, the first contact material layer 210, the sacrificial layer 300 and the remaining protective layer 400 after pickling. Specifically, after pickling, the native oxide on the surface of each of the active areas 110 exposed to the grooves or holes 130 is removed, and the protective layer 400 is still retained on the sidewall of each of the grooves or holes 130.

Figure 7:
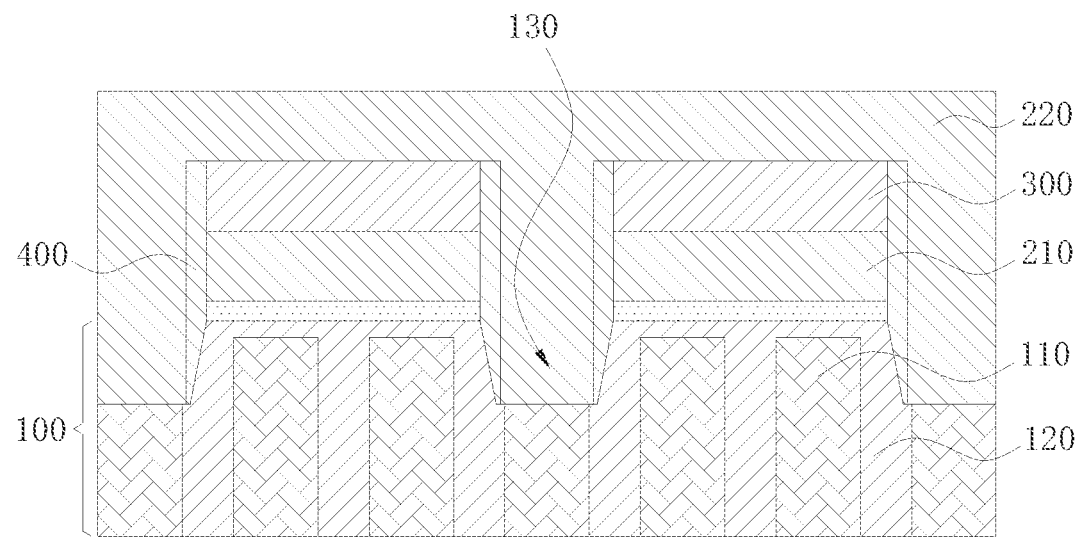

As shown in FIG. 7, in an implementation of the present disclosure, in the step of "forming a second contact material layer 220", the semiconductor structure includes the substrate 100, the first contact material layer 210, the sacrificial layer 300, the remaining protective layer 400, and the second contact material layer 220. Specifically, the second contact material layer 220 covers the substrate 100, the sacrificial layer 300, and the protective layer 400; the grooves or holes 130 are filled with the second contact material layer 220, and the second contact material layer 220 is in contact with the surface of each of the active areas 110 exposed at the bottom of the grooves or holes 130. Compared with the prior art in which the contact material layer in each of the grooves or holes has voids since the sidewall of each of the grooves or holes is eroded in the pickling process, in the present disclosure, the protective layer 400 retained on the sidewall of each of the grooves or holes 130 provides a protection function, such that the sidewall of each of the grooves or holes 130 or the shallow trench isolation structure 120 next to the active area 110 will not be eroded in the pickling process, and can maintain the original appearance. Therefore, the second contact material layer 220 in each of the grooves or holes 130 will not have voids, thereby ensuring effective contact between the contact structure formed in the subsequent process and the active area 110 and improving the device performance of the semiconductor structure.

Figure 8:
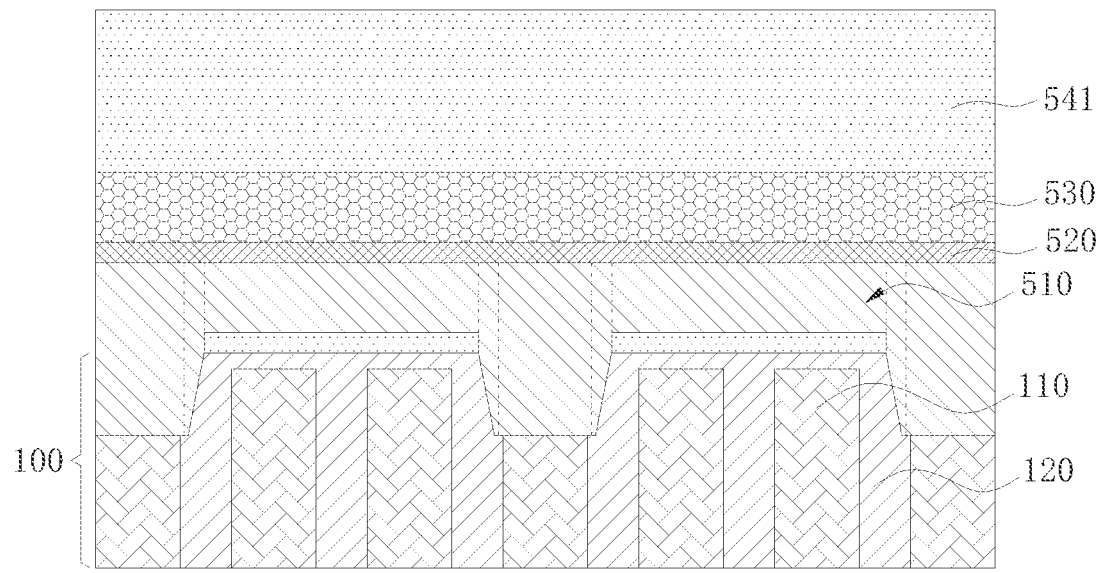

As shown in FIG. 8, In an implementation of the present disclosure, in the step of "removing the sacrificial layer 300, the protective layer 400 formed on the sidewall of the sacrificial layer, and partial second contact material layer 220" and the step of "sequentially forming a bit line barrier layer 520, a bit line conductive layer 530 and a first isolation layer 541 on a surface of the bit line contact layer 510", the semiconductor structure includes the substrate 100, the first contact material layer 210, the remaining protective layer 400, the remaining second contact material layer 220, the bit line barrier layer 520, the bit line conductive layer 530, and the first isolation layer 541. Specifically, the sacrificial layer 300, the protective layer 400 formed on the surface of the sacrificial layer, and partial second contact material layer 220 are removed by means of, for example, but not limited to, chemical mechanical polishing (CMP), such that the first contact material layer 210 is exposed. That is, the surface of the first contact material layer 210 is substantially flush with the surface of the remaining second contact material layer 220. In this case, the first contact material layer 210 and the remaining second contact material layer 220 (including the remaining protective layer 400) jointly form the bit line contact layer 510. On this basis, the bit line barrier layer 520 covers the surface of the bit line contact layer 510, the bit line conductive layer 530 covers the surface of the bit line barrier layer 520, and the first isolation layer 541 covers the surface of the bit line conductive layer 530.

Figure 9:
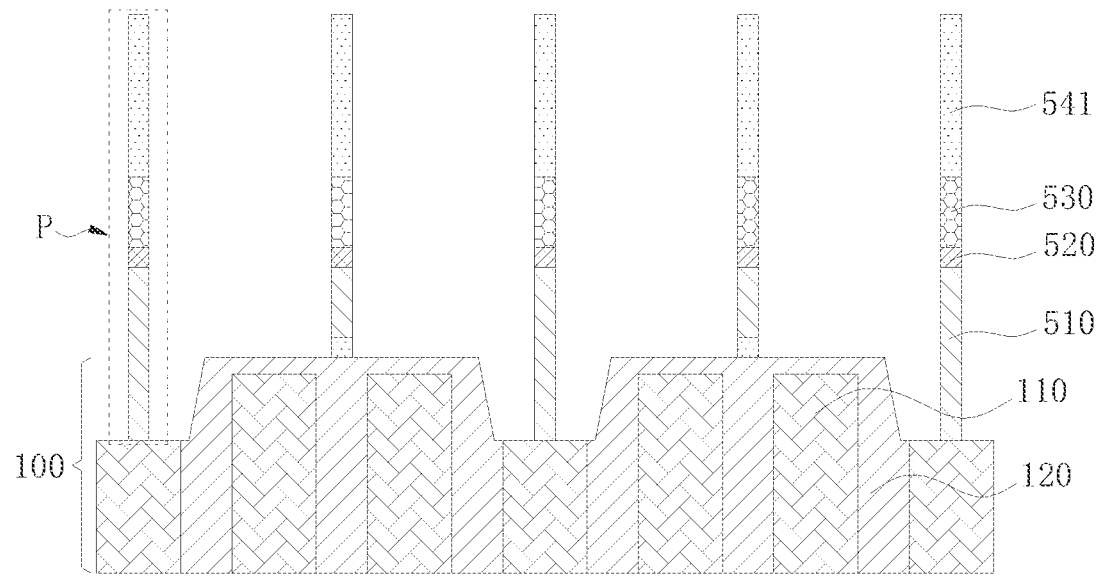

As shown in FIG. 9, in an implementation of the present disclosure, in the step of "forming a plurality of wall structures on the surface of the substrate 100", the semiconductor structure includes the substrate 100 and the wall structures P formed on the surface of the substrate 100 after etching. Specifically, the wall structure P includes a bit line contact layer 510, a bit line barrier layer 520, a bit line conductive layer 530, and a first isolation layer 541. The wall structure P located in each of the grooves or holes 130 is only in contact with the surface of each of the active areas 110 exposed to the grooves or holes 130. Therefore, in the etching process, the sidewall of each of the grooves or holes 130 and the shallow trench isolation structure 120 at the inner side will not be eroded during etching under the protection of the protective layer 400.

Figure 10:
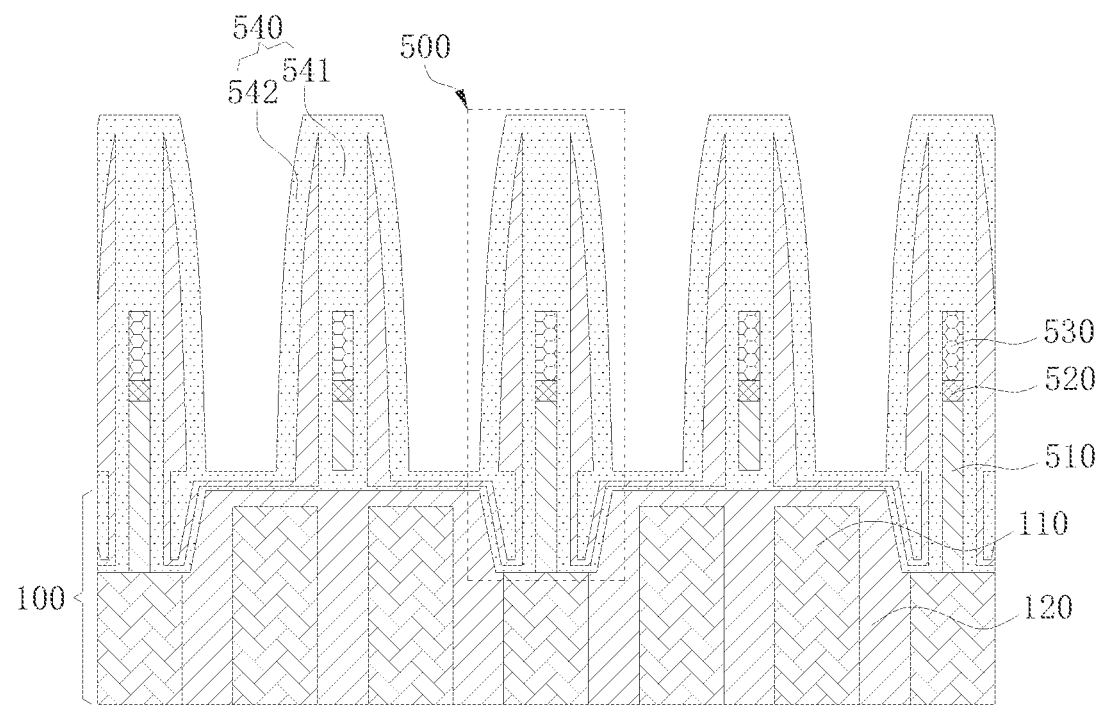

As shown in FIG. 10, in an implementation of the present disclosure, in the step of "forming a second isolation layer 542", the semiconductor structure includes the substrate 100, the wall structures P, and the second isolation layer 542. Specifically, the second isolation layer 542 covers the wall structure P; the second isolation layer 542 and the first isolation layer 541 jointly form the bit line isolation layer 540. Therefore, the bit line isolation layer 540, the bit line conductive layer 530, the bit line barrier layer 520, and the bit line contact layer 510 jointly form the bit line structure 500.

As shown in FIG. 11, in an implementation of the present disclosure, in the step of "filling with an oxide material layer 700", the semiconductor structure includes the substrate 100, the bit line structure 500, and the oxide material layer 700. Specifically, a space between adjacent bit line structures 500 is filled with the oxide material layer 700, and the oxide material layer 700 covers partial substrate 100 between adjacent bit line structures 500. FIG. 12 specifically shows the semiconductor structure after the step of "etching the substrate 100 by the oxide material layer 700". In this case, the substrate 100 located between adjacent bit line structures 500 is partially removed, and the oxide material layer 700 is also removed in the etching process, to form a contact hole 610. The contact hole 610 is located between adjacent bit line structures 500, and the contact hole 610 exposes the active area 110 in the substrate 100.

As shown in FIG. 13, in an implementation of the present disclosure, in the step of "forming a capacitive contact layer 600", the semiconductor structure includes the substrate 100, the bit line structure 500, and the capacitive contact layer 600. Specifically, the space between adjacent bit line structures 500 may be first filled with a third contact material layer, where the contact hole 610 is filled with the third contact material layer. Then, the third contact material layer is etched back to remove partial third contact material layer at the top and retain partial third contact material layer at the bottom, that is, the retained third contact material layer includes the part in the contact hole 610. In this way, the remaining third contact material layer forms the capacitive contact layer 600. Because the active area 110 of the substrate 100 is exposed to the contact hole 610, the capacitive contact layer 600 is in contact with the expected active area 110 in the contact hole 610.

It should be noted here that the manufacturing method of a semiconductor structure shown in the drawings and described in the specification only show a few examples of the many methods that may adopt the principles of the present disclosure. It should be clearly understood that the principle of the present disclosure is by no means limited to any details or any steps of the manufacturing method of a semiconductor structure shown in the drawings or described in this specification.

Based on the above detailed description on the exemplary implementations of the manufacturing method of a semiconductor structure proposed by the present disclosure, an exemplary implementation of the semiconductor structure proposed by the present disclosure will be described below.

As shown in FIG. 13, in an implementation of the present disclosure, the semiconductor structure provided by the present disclosure is manufactured by the manufacturing method of a semiconductor structure detailed in the foregoing implementation of the present disclosure. Because the protective layer 400 is formed in the semiconductor structure before pickling, the sidewall of each of the grooves or holes 130 and the shallow trench isolation structure 120 at the inner side are protected by the protective layer 400 in the pickling process, thereby protecting the active area 110 and preventing each of the grooves or holes 130, the shallow trench isolation structure 120, and the active area 110 from being eroded in the pickling step. Through the above design, the contact structure (such as the capacitive contact layer 600) of the semiconductor structure provided by the present disclosure is in effective contact with the active area 110, achieving good device performance.

In an implementation of the present disclosure, the present disclosure provides a semiconductor structure. The semiconductor structure includes a substrate, bit line structures, and a protective layer. Specifically, the bit line structures are arranged on the substrate, and the protective layer is located on sidewalls of the bit line structures in an extension direction. Taking the semiconductor structure shown in FIG. 13 as an example, the extension direction of the bit line structure is a direction perpendicular to the paper surface (or at an inclined angle with the paper surface). The protective layer is located on the sidewall in the extension direction of the bit line structure.

According to an implementation of the present disclosure, a material of the protective layer is undoped polysilicon or silicon nitride.

According to an implementation of the present disclosure, a thickness of the protective layer is 3 nm to 9 nm.

According to an implementation of the present disclosure, the semiconductor structure further includes a capacitive contact layer, where the capacitive contact layer is located between adjacent bit line structures.

It should be noted here that the semiconductor structure shown in the drawings and described in the specification only show a few examples of the many semiconductor structures that may adopt the principles of the present disclosure. It should be clearly understood that the principle of the present disclosure is by no means limited to any details or any components of the semiconductor structure shown in the drawings or described in the specification.

In conclusion, in the manufacturing method of a semiconductor structure proposed in the present disclosure, before the pickling step, each of the grooves or holes 130 formed on the surface of the substrate 100 for connecting the bit line structure 500 to the active area 110 is covered by the protective layer 400, and then the protective layer 400 at the bottom of each of the grooves or holes 130 is removed, to expose the surface of each of the active areas 110 having the native oxide, while partial protective layer 400 on the sidewall of each of the grooves or holes 130 is retained, such that the sidewall of each of the grooves or holes 130 or the shallow trench isolation structure 120 will not be eroded in the pickling step. Through the foregoing design, the present disclosure can ensure that the contact structure formed in the subsequent process is in effective contact with the active area 110, thereby improving the device performance of the semiconductor structure, and also alleviating or avoiding the voids and leakage current.

Specifically, since the surface roughness of each of the grooves or holes formed after etching of the bit line contact structure varies (materials are different from top to bottom), if a large number of contact material layers (corresponding to the second contact material layer in the present disclosure, such as doped polysilicon (doping poly)), the contact material layer (e.g. doped polysilicon) is not adhered closely enough to surfaces of various materials on the one hand, and on the other hand, it easily creates a void at a position flush with AA, resulting in a short circuit between the contact structure and the bit line structure. In the manufacturing method of a semiconductor structure proposed in the present disclosure, a protective layer (such as undoped polysilicon or silicon nitride) is formed first, i.e., a thin protective layer is first deposited on the sidewall of each of the grooves or holes. The protective layer can form a better adhesion with the sidewall. When the contact material layer (such as doped polysilicon) is deposited later, because the contact surface of the contact material layer (such as doped polysilicon) has only one material, i.e., the protective layer, the material deposited at the interface will be denser and less likely to form voids.

In an implementation, when the material of the protective layer is undoped polysilicon, the protective layer can also achieve a shielding effect. If the contact material layer (such as doped polysilicon) is directly deposited, phosphorus (P) with high concentration in doped polysilicon will be directly diffused to the surrounding AA through the STI. In addition, nitride and tungsten of the buried word line absorb phosphorus greatly, leading to a serious current leakage (LKG) problem. A thin layer of undoped polysilicon can block phosphorus from diffusing to the surroundings, which can alleviate or avoid the leakage current.

Exemplary implementations of the forming manufacturing method of a semiconductor structure, and the semiconductor structure provided by the present disclosure are described in detail and/or illustrated above. However, the implementations of the present disclosure are not limited to the specific implementations described herein.

On the contrary, the components and/or steps in each implementation can be used independently and separately from other steps and/or steps described herein. Each component and/or each step of one implementation can also be used in combination with other components and/or steps of other implementations. During introduction of the elements/components/and the like described and/or illustrated herein, the terms such as "one", "a" and "the" are used to indicate the presence of one or more elements/components/and the like. The terms "include", "comprise" and "has" are used to indicate an open-ended inclusion and to mean that additional elements/components/and the like may exist in addition to the listed elements/components/and the like. In addition, the terms "first" and "second" in the claims and the specification are used only as markers, not as a limit to the numbers of objects.

Although the manufacturing method of a semiconductor structure and the semiconductor structure proposed by the present disclosure has been described according to different specific embodiments, a person skilled in the art will realize that changes can be made to the implementation of the present disclosure without departing from the spirit and scope of the claims.

The invention claimed is:

1. A manufacturing method of a semiconductor structure, comprising:
   providing a substrate, wherein the substrate has active areas, and grooves or holes each for connecting a bit line structure to the active area are formed on a surface of the substrate;
   forming a protective layer, wherein the protective layer covers a bottom and a sidewall of each of the grooves or holes;
   removing the protective layer located at the bottom of each of the grooves or holes;
   performing pickling to remove a native oxide on a surface of each of the active areas exposed at the bottom of the grooves or holes, wherein partial protective layer is retained on the sidewall of each of the grooves or holes after pickling; and
   forming bit line structures.

2. The manufacturing method of a semiconductor structure according to claim 1, wherein a material of the protective layer is undoped polysilicon or silicon nitride.

3. The manufacturing method of a semiconductor structure according to claim 1, wherein the forming a protective layer, a thickness of the protective layer is 5 nm to 15 nm.

4. The manufacturing method of a semiconductor structure according to claim 1, wherein a thickness of the protective layer retained on the sidewall of each of the grooves or holes after pickling is 3 nm to 9 nm.

5. The manufacturing method of a semiconductor structure according to claim 1, wherein the performing pickling to remove a native oxide on a surface of each of the active areas exposed at the bottom of the grooves or holes comprises:
   washing the surface of each of the active areas exposed at the bottom of the grooves or holes by a pickling solution, and performing plasma surface treatment on the surface of each of the active areas exposed at the bottom of the grooves or holes.

6. The manufacturing method of a semiconductor structure according to claim 1, wherein sequentially stacked a first contact material layer and a sacrificial layer are formed on the surface of the substrate, the formed protective layer covers the bottom and the sidewall of each of the grooves or holes and the sacrificial layer, and the removing the protective layer located at the bottom of each of the grooves or holes further comprises:
   removing the protective layer at a top of the sacrificial layer at the same time.

7. The manufacturing method of a semiconductor structure according to claim 6, wherein the forming bit line structures comprises:
   forming a second contact material layer, wherein the second contact material layer covers the protective layer and the sacrificial layer, and the grooves or holes are filled with the second contact material layer;
   removing the sacrificial layer, the protective layer formed on a sidewall of the sacrificial layer, and partial second contact material layer, wherein the remaining second contact material layer, the remaining protective layer, and the first contact material layer form a bit line contact layer;
   sequentially forming a bit line barrier layer, a bit line conductive layer and a first isolation layer on a surface of the bit line contact layer;
   etching to partially remove the bit line contact layer, the bit line barrier layer, the bit line conductive layer, and the first isolation layer, to form a plurality of wall structures on the surface of the substrate; and
   forming a second isolation layer, wherein the second isolation layer covers the wall structures and the substrate; the second isolation layer and the first isolation layer form a bit line isolation layer; and the bit line isolation layer, the bit line conductive layer, the bit line barrier layer and the bit line contact layer form a bit line structure.

8. The manufacturing method of a semiconductor structure according to claim 7, wherein a method of forming the second isolation layer comprises:
   forming a silicon nitride layer on a surface of the wall structures and the surface of the substrate; or
   forming a silicon oxide layer on a surface of the wall structures and the surface of the substrate; or
   sequentially forming a silicon nitride layer, a silicon oxide layer and a silicon nitride layer on a surface of the wall structures and the surface of the substrate, to form the second isolation layer.

9. The manufacturing method of a semiconductor structure according to claim 8, the method further comprises:
   forming a capacitive contact layer, wherein the capacitive contact layer is located between adjacent ones of the bit line structures.

10. The manufacturing method of a semiconductor structure according to claim 9, wherein the forming a capacitive contact layer comprises:
    filling a space between adjacent ones of the bit line structures with an oxide material layer, and etching the substrate located between adjacent ones of the bit line structures by the oxide material layer, to expose expected active area;

forming a third contact material layer, wherein the third contact material layer is located between adjacent ones of the bit line structures and is in contact with the expected active area; and partially removing the third contact material layer, wherein the remaining third contact material layer forms the capacitive contact layer.

\* \* \* \* \*